United States Patent
Chou et al.

(10) Patent No.: US 6,867,955 B2
(45) Date of Patent: Mar. 15, 2005

(54) ARC DISCHARGE PROTECTION APPARATUS

(75) Inventors: Chin-Wen Chou, Hsin-Tien (TW);
Eddie Cheng, Hsin-Tien (TW);
Kuang-Ming Wu, Hsin-Tien (TW);
Chin-Biau Chung, Hsin-Tien (TW)

(73) Assignee: Zippy Technology Corp., Hsin-Tien (TW)

( * ) Notice: Subject to any disclaimer, the term of this patent is extended or adjusted under 35 U.S.C. 154(b) by 0 days.

(21) Appl. No.: 10/633,415

(22) Filed: Aug. 4, 2003

(65) Prior Publication Data

US 2005/0030687 A1 Feb. 10, 2005

(51) Int. Cl.$^7$ .............................................. H02H 3/00
(52) U.S. Cl. .......................................... 361/42; 369/111
(58) Field of Search ............................. 361/42, 47, 48, 361/49, 50, 88, 43.1, 38, 111, 40, 41.1, 112, 117, 230; 324/102, 500, 509, 510, 511, 522, 544, 547, 554; 340/655, 646, 647, 649, 650

(56) References Cited

U.S. PATENT DOCUMENTS 5,418,463 A * 5/1995 Fleming et al. ............. 324/520
6,115,230 A * 9/2000 Voigts et al. ................ 361/230
6,683,766 B1 * 1/2004 Guo et al. .................... 361/42

FOREIGN PATENT DOCUMENTS

JP          55166662    * 12/1980    .......... G03G/15/02

* cited by examiner

Primary Examiner—Ronald Leja
(74) Attorney, Agent, or Firm—Birch, Stewart, Kolasch & Birch, LLP

(57) ABSTRACT

An arc discharge protection apparatus to prevent arc discharge from occurring in a high voltage output zone caused by abnormal conditions includes an electrode plate to absorb high voltage arc discharge signals released by a voltage boosting unit in the high voltage output zone. A voltage switch unit receives the high voltage arc discharge signals absorbed by the electrode plate and transforms to low voltage arc discharge signals. A rectification unit receives and rectifies the low voltage arc discharge signals and outputs an arc hybrid wave. A trigger unit detects the arc hybrid wave and outputs a trigger signal to stop operation of the control unit or driving unit, thereby prevents arc discharge from causing damage to the surrounding elements resulting from accumulation of heat or sparks.

10 Claims, 5 Drawing Sheets

ARC DISCHARGE PROTECTION APPARATUS

FIELD OF THE INVENTION

The present invention relates to a protection apparatus for use in the event of arc discharge happened in a high voltage output zone that has abnormal conditions to provide detection and trigger a control signal to stop high voltage output in the high voltage output zone.

BACKGROUND OF THE INVENTION

"Arc discharge" is a phenomenon happened between two electrodes that have a high voltage between them. When the two electrodes are moved gradually and closely to each other at a selected distance, an arch-like electric spark occurs between them that is somewhat like the lightning taking place in the thunderstorm. However the lightning comes and goes in a flash, the spark between two electrodes may exist for a long period of time and may form heat accumulation.

In electronics, arc discharge often damages the function of electronic elements and results in dysfunction of electronic circuits. In serious situations, it even becomes hazardous to the safety of human life. For instance, in conventional high voltage output loads (such as cold-cathode tube, negative ion generator, TV cathode-ray tube and the like), before the load receives a high voltage, if the contact is poor, ambient temperature and humidity varies or some elements of the electronic circuits are ruptured or damaged, the arc discharge happens. Hence how to provide an arc discharge protection apparatus on the potential arc discharge location to prevent the load device from being damaged is one of the key research and development directions in the industry. The commonly used design and elements at present for arc discharge protection apparatus such as voltage boosting device in the conventional high voltage transformer, and ceramic and piezoelectric transformer and the like are elaborated as follows:

Refer to FIG. 1 for the general high voltage transformer or ceramic transformer. It has a constant operation frequency. And a control unit 11 provides a control frequency. Under the alternate mating of these two frequencies, a high AC voltage is generated during the alternate period. A voltage boosting unit 13 has an output end which might form a fracture or a small gap due to poor contact or other unknown reasons. As a result, arc discharge occurs. It is a high voltage arc discharge that directly affects the service life of the surrounding elements. It also indirectly affects the load 14. Therefore an electrical leak protection device 30 is generally being provided. The electrical leak protection device 30 includes an electrical leak switch to protect short circuit that breaks off when the arc discharge takes place. However, the electrical leak protection device 30 usually is used only on small mechanical equipment that have smaller vibrations to ensure that an adequate arc distance is spared in the ejecting direction of the arc. The electrical leak protection device 30 is not suitable to be installed on the location where mechanical vibration is great or alternate magnetic field is strong. Moreover, installation of the electrical leak protection device 30 also has to take into account of the damages resulting from moisture and dust. Hence extra protection measures must be taken. Thus the practicality is lower and installation cost is higher. All this reduces its economic effectiveness.

Refer to FIG. 2 for a voltage boosting unit 13 consisting of a transformer made of piezoelectric plates. The voltage boosting unit 13 includes a transformer (piezoelectric plates) 131 and a circuit board 133 that are connected by a lead 132. There is a coupling location 134 between the circuit board 133 and a load 14. Take an inverter circuit as an example. The factors attributed to arc discharge generation include (1) varying of temperature and humidity causes rupture or poor contact on the lead 132, (2) aging or break down of the transformer (piezoelectric plates), (3) aging or improper use of the coupling location 134 results in a gap between the male plug and female receptacle, (4) the load 14 breaks off. All the foregoing factors could generate an arc discharge signal when a high voltage is output at the output end. In FIG. 2, an arc switch device 40 is provided to receive and channel the arc discharge signal to a ground end. But such a device cannot eliminate all the arc discharge signals. Hence it does not control the operation of the entire circuit. The voltage boosting unit 13 still has residual arc discharge signals due to poor contact, or change of temperature and humidity. Furthermore, during conduction to the ground, the circuit board 133 connected to the transformer (piezoelectric plates) still has arc discharge due to continuous voltage increasing and discharging of the transformer (piezoelectric plates). As a result, heat is accumulated or sparks occur and burn out may happen.

As previously discussed, conventional arc discharge protection apparatus cannot completely prevent arc discharge and have many restrictions. Their applicability is limited.

SUMMARY OF THE INVENTION

Therefore the primary object of the invention is to provide a complete arc discharge protection apparatus that stops the entire circuit when unstable conditions occur thereby prevents circuit boards or other electronic elements from being damaged by arc discharge and effectively prevent arc discharge from occurring.

The invention mainly detects and triggers a control signal to stop high voltage output in a high voltage output zone when abnormal conditions occur in the high voltage zone that might otherwise generate arc discharge.

The arc discharge protection apparatus uses an electrode plate to absorb the high voltage arc discharge signals released by a voltage boosting unit in the high voltage output zone; then a voltage switch unit receives the high voltage arc discharge signals absorbed by the electrode plate and transforms to low voltage arc discharge signals; a rectification unit receives and rectifies the low voltage arc discharge signals and outputs an arc hybrid wave; a trigger unit detects the arc hybrid wave and outputs a trigger signal to stop operation of the control unit or driving unit, thereby prevents arc discharge from causing damage to the surrounding elements resulting from accumulation of heat or sparks.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
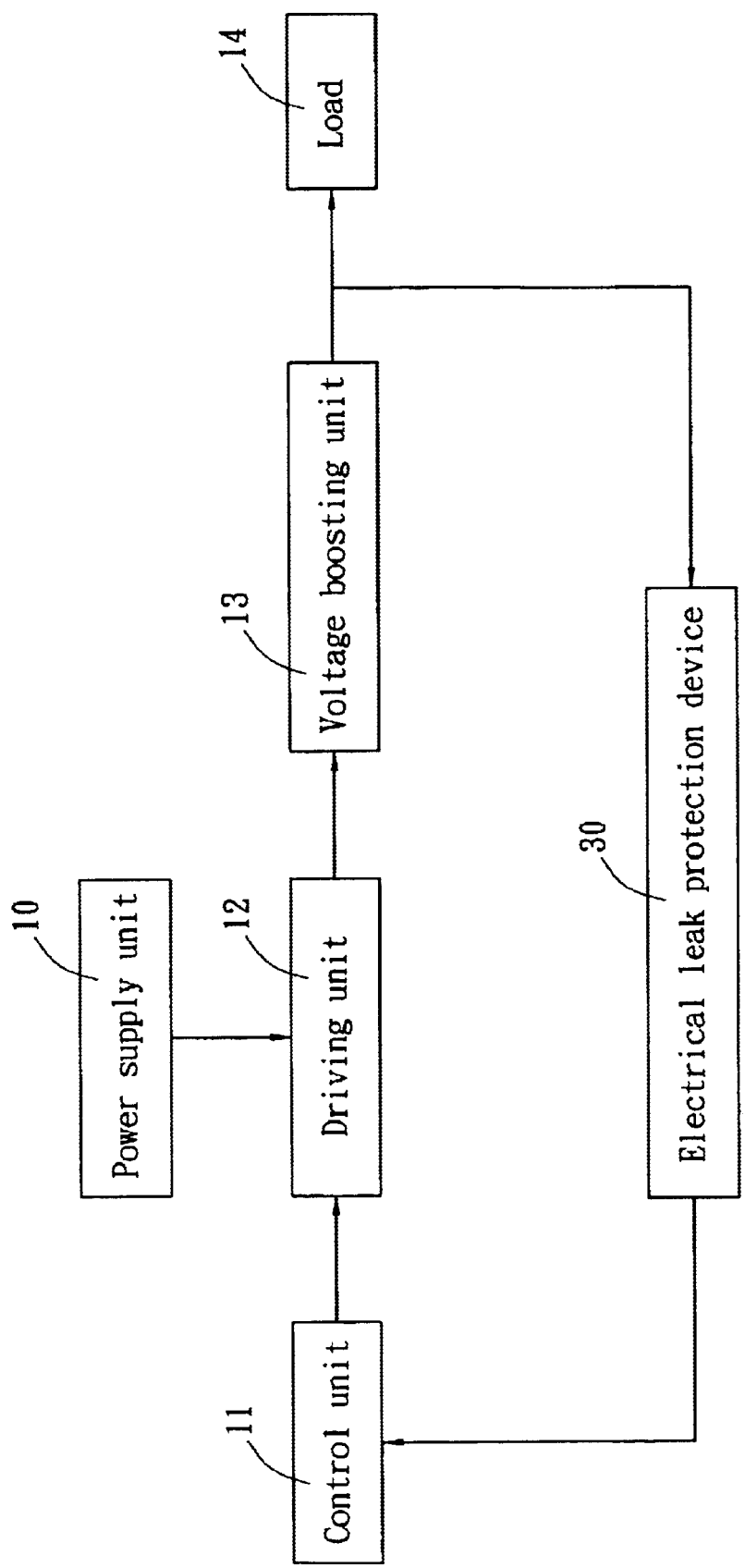
FIG. 1 is a structural block diagram of a conventional electrical leak protection apparatus.
Figure 2:
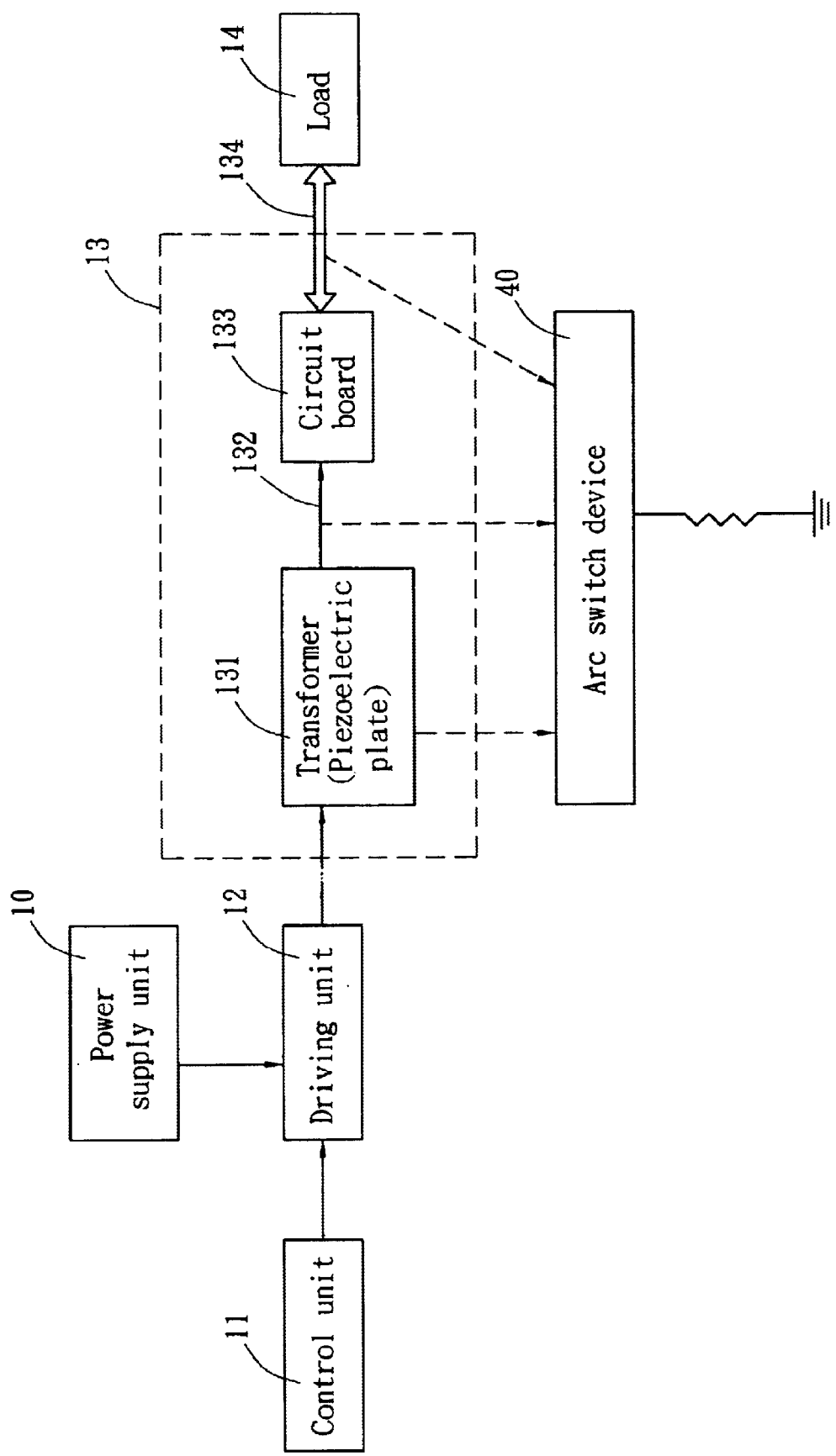
FIG. 2 is a structural block diagram of a conventional arc switch device.
Figure 3:
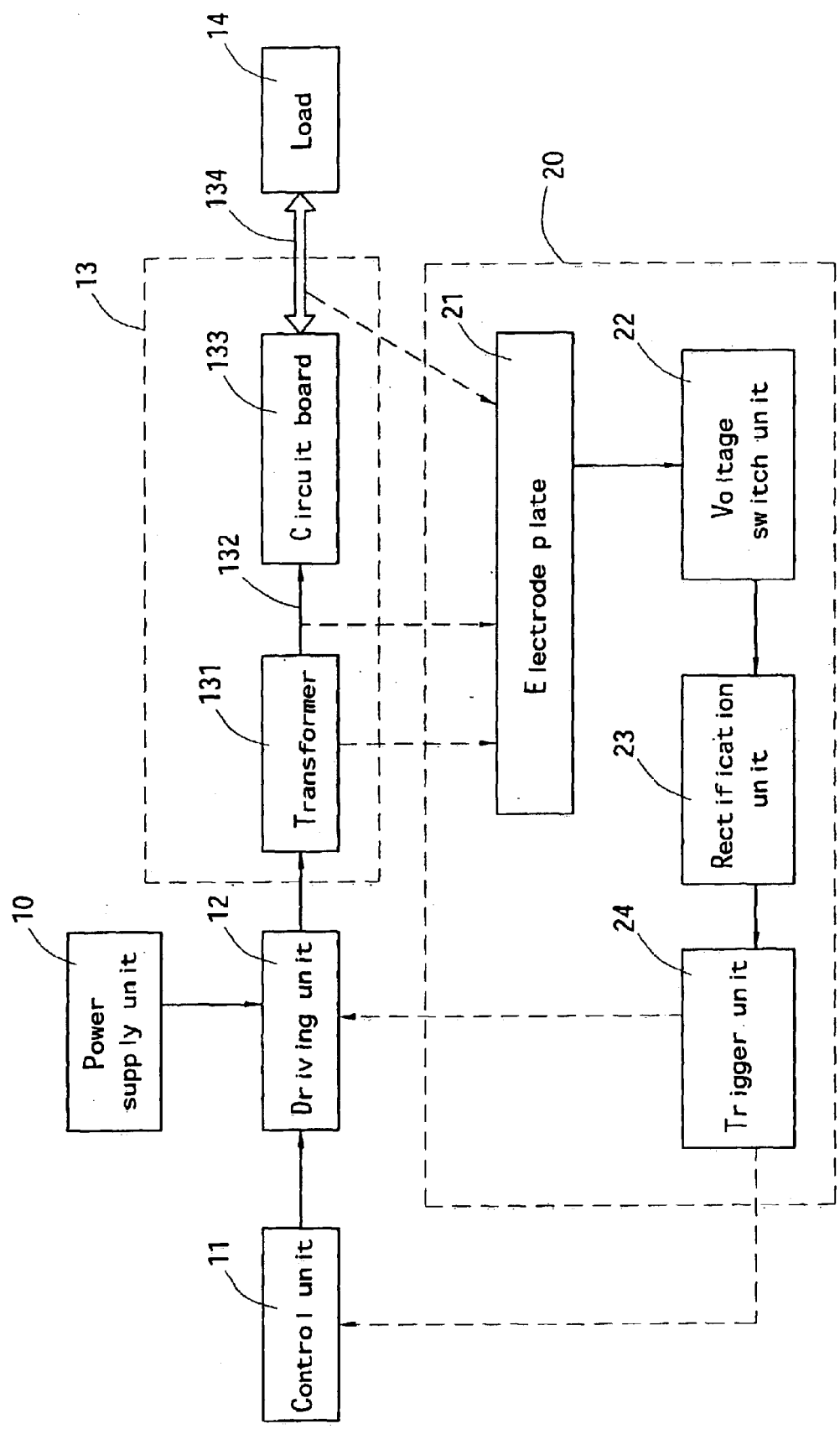
FIG. 3 is a circuit flow block diagram of the invention.

Please refer to FIG. 3, the arc discharge protection apparatus 20 of the invention is to prevent arc discharge occurred in a high voltage output zone caused by abnormal conditions. The high voltage output zone includes a power supply unit 10 to provide power supply, a control unit 11 to provide voltage distribution signals, a driving unit 12 to receive the power supply and voltage distribution signals and transform voltage, a voltage boosting unit 13 to receive the transformed voltage and transform to a high voltage and a load 14 connecting to a high voltage output end of the voltage boosting unit 13 (the load 14 is an electronic product driven by high voltage such as cold-cathode tube, negative ion generator, and the like). (The principles of power supply input, voltage distribution, voltage transformation and high voltage driving are known in the art and form no part of the invention, thus details are omitted).

The arc discharge protection apparatus 20 of the invention mainly includes an electrode plate 21 for absorbing high voltage arc discharge signals released by the voltage boosting unit 13. The electrode plate 21 is a copper foil or a conductor capable of absorbing electric arc. The electrode plate 21 is located in the high voltage output zone where arc discharge is likely to occur. In the invention, the voltage boosting unit 13 includes a transformer 131 and a circuit board 133. The spots where arc discharge are likely to occur include the transformer 131 (in the event of ruptured), lead 132 between the transformer 131 and the circuit board 133 (when the lead 132 is aged and ruptures caused by changes of temperature and humidity), coupling location 134 of the circuit board 133 and the load 14 (due to aging or improper use of the coupling location 134 and form a gap between the male plug and the female receptacle). A voltage switch unit 22 consisting of voltage switch circuits made of a cluster of impedance elements is provided to receive the high voltage arc discharge signals absorbed by the electrode plate 21 and transform to a low voltage arc discharge signal. Meanwhile, a rectification unit 23 consisting of diodes and capacitors is provided to receive and rectify the low voltage arc discharge signal of the voltage switch unit 22 and output an arc hybrid wave. The arc hybrid wave is detected by a trigger unit 24 which in turn outputs a trigger signal to stop the operation of the control unit 11 or the driving unit 12, thereby prevents arc discharge from occurring. The trigger unit 24 is a silicon rectifier or flip-flop.

Based on the circuit process previously discussed, it can be seen that in the event that damage or breaking occurs on any spot in the high voltage output zone and the load 14 cannot be driven by the high voltage, and are discharge occurs, the electrode plate 21 absorbs the arc, the voltage switch unit 22 switches the voltage, the rectification unit 23 rectifies to an arc mixed wave, and the trigger unit 24 detects and issues a trigger signal to stop the control unit 11 or the driving unit 12 from operating. The entire high voltage output zone immediately stops high voltage transformation and output. Therefore no arc discharge occurs. And there is no heat accumulation or sparks, and the surrounding elements may avoid from being damaged. And the risk of burning out may also be prevented.

Figure 4:
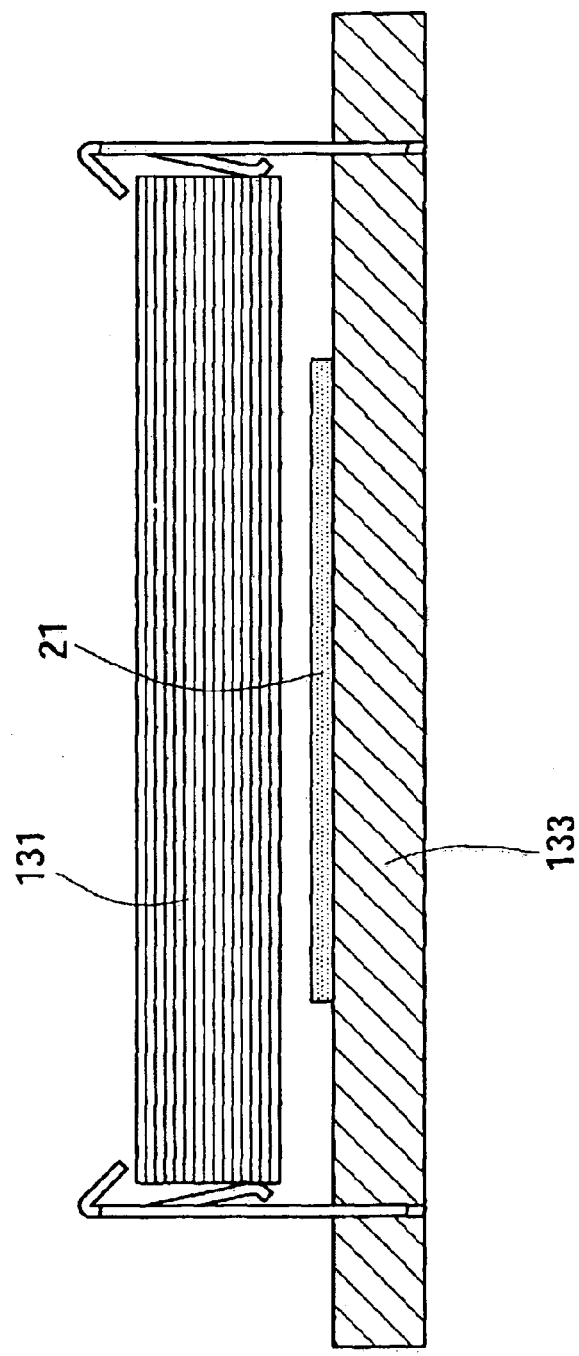
FIG. 4 is a schematic view of the configuration of the electrode plate of the invention.

Refer to FIG. 4 for the configuration of the electrode plate 21. Targeted the arc discharge caused by rupturing of the transformer 131, the electrode plate 21 of the invention may be located at the bottom of the high voltage output end of the transformer 131 and may be adhered to the surface of the circuit board 133. It is to be noted that the electrode plate 21 must be spaced from the transformer 131 at an arc-over distance. When the high voltage output end of the transformer 131 generates arc discharge, the arc signal is absorbed by the electrode plate 21 and is transferred to a circuit corresponding to the voltage switch unit 22 to achieve protection effect.

Figure 5:
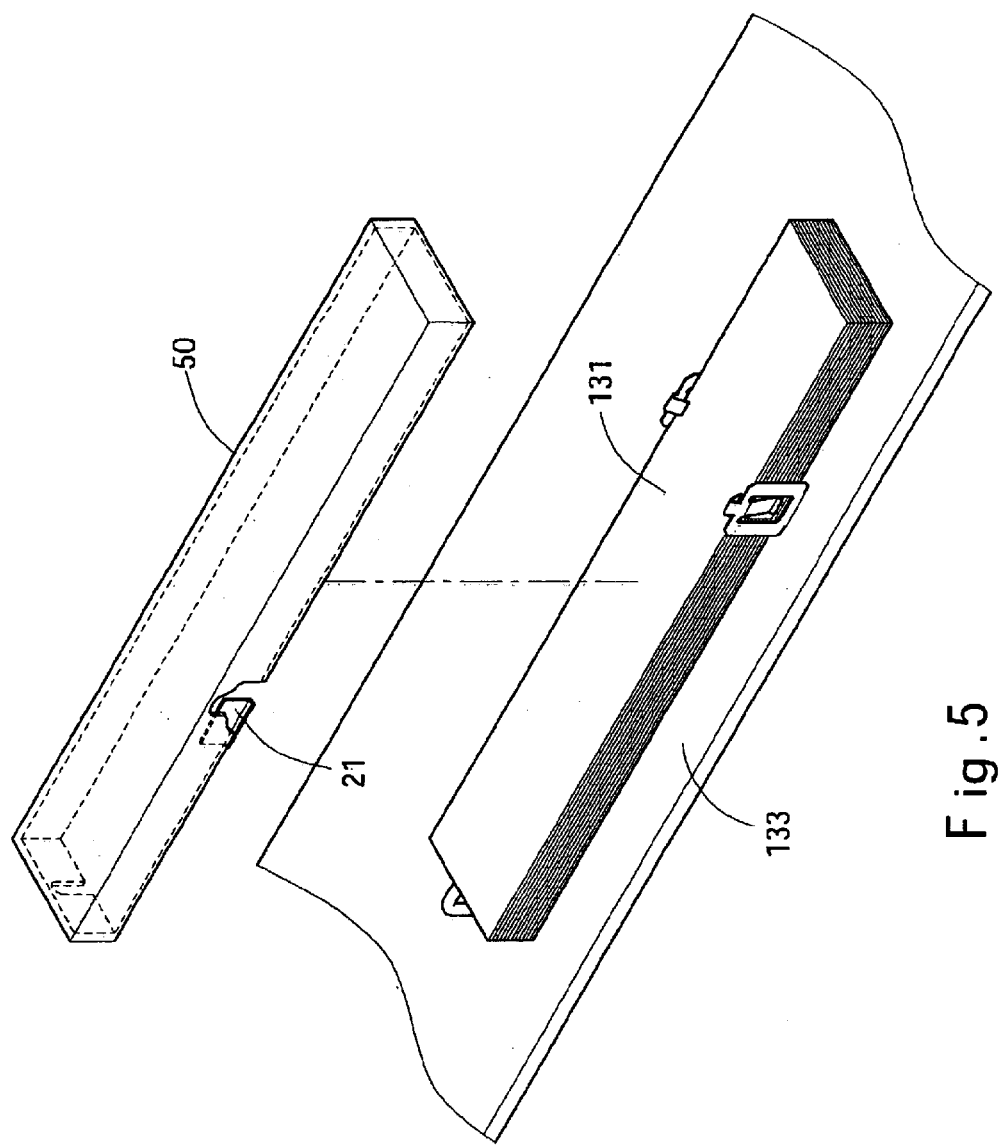
FIG. 5 is a schematic view of another embodiment of the configuration of the electrode plate of the invention.

Refer to FIG. 5 for another embodiment of the configuration of the electrode plate 21. It also is targeted to the arc discharge that might occur due to rupturing of the transformer 131. The difference from the FIG. 4 is that the transformer 131 is covered by a cap 50. The electrode plate 21 is located on an inner wall of the cap 50. Similarly, the electrode plate 21 must be spaced from the transformer 131 at an arc-over distance. When the high voltage output end of the transformer 131 generates arc discharge, the arc signal is absorbed by the electrode plate 21 and is transferred to a circuit corresponding to the voltage switch unit 22 to achieve protection effect.

What is claimed is:

1. An arc discharge protection apparatus to prevent arc discharge from occurring in a high voltage output zone caused by abnormal conditions, the high voltage output zone including a power supply unit to provide power supply input, a control unit to provide voltage distribution signals, a driving unit to receive the power supply and the voltage distribution signals and transform voltage, a voltage boosting unit to receive the transformed voltage and transform to a high voltage and a load connecting to a high voltage output end of the voltage boosting unit, the arc discharge protection apparatus comprising:

an electrode plate for absorbing high voltage arc discharge signals released by the voltage boosting unit;

a voltage switch unit for receiving the high voltage arc discharge signals absorbed by the electrode plate and transforming to low voltage arc discharge signals;

a rectification unit for receiving and rectifying the low voltage arc discharge signals of the voltage switch unit and outputting an arc hybrid wave; and a trigger unit for detecting the arc hybrid wave and outputting a trigger signal to stop operation of the control unit or the driving unit to prevent the arc discharge from occurring.

2. The arc discharge protection apparatus of claim 1, wherein the electrode plate is a copper foil or a conductor having a property to absorb electric arc.

3. The arc discharge protection apparatus of claim 1, wherein the voltage switch unit includes a voltage switch circuit which consists of a cluster of impedance elements.

4. The arc discharge protection apparatus of claim 1, wherein the rectification unit includes a rectification circuit which consists of diodes and capacitors.

5. The arc discharge protection apparatus of claim 1, wherein the trigger unit is a silicon rectifier.

6. The arc discharge protection apparatus of claim 1, wherein the trigger unit is a flip-flop.

7. The arc discharge protection apparatus of claim 1, wherein the voltage boosting unit includes a transformer and a circuit board, the electrode plate being located on a location corresponding to the transformer.

8. The arc discharge protection apparatus of claim 1, wherein the voltage boosting unit includes a transformer and a circuit board, the electrode plate being located on a lead between the transformer and the circuit board.

9. The arc discharge protection apparatus of claim 1, wherein the voltage boosting unit includes a transformer and a circuit board, the electrode plate being located on a coupling location between the circuit board and the load.

10. The arc discharge protection apparatus of claim 7, wherein the transformer is covered by a cap, the electrode plate being located on an inner wall of the cap.

* * * * *